(12) United States Patent
Forbes

(10) Patent No.: US 7,271,433 B1
(45) Date of Patent: Sep. 18, 2007

(54) HIGH-DENSITY SINGLE TRANSISTOR VERTICAL MEMORY GAIN CELL

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 308 days.

(21) Appl. No.: 10/934,299

(22) Filed: Sep. 2, 2004

(51) Int. Cl.
H01L 29/76 (2006.01)

(52) U.S. Cl. .................... 257/302; 257/288; 257/357; 257/390; 257/E29.129; 257/E27.084

(58) Field of Classification Search ................. 257/288, 257/302, 357, 390, E29.129, E27.084
See application file for complete search history.

(56) References Cited

U.S. PATENT DOCUMENTS

| | | | |
|---|---|---|---|
| 5,414,287 A | 5/1995 | Hong | |
| 5,416,350 A | 5/1995 | Watanabe | |
| 5,936,274 A | 8/1999 | Forbes et al. | |
| 5,973,356 A | 10/1999 | Noble et al. | |
| 5,991,225 A | 11/1999 | Forbes et al. | |
| 6,072,209 A | 6/2000 | Noble et al. | |
| 6,090,661 A | 7/2000 | Perng et al. | |
| 6,097,065 A | 8/2000 | Forbes et al. | |
| 6,124,729 A | 9/2000 | Noble et al. | |
| 6,143,636 A | 11/2000 | Forbes et al. | |
| 6,150,687 A | 11/2000 | Noble et al. | |
| 6,153,468 A | 11/2000 | Forbes et al. | |
| 6,174,780 B1 | 1/2001 | Robinson | |
| 6,238,976 B1 | 5/2001 | Noble et al. | |
| 6,246,083 B1 | 6/2001 | Noble | |
| 6,352,864 B1 | 3/2002 | Lee | |
| 6,538,916 B2 | 3/2003 | Ohsawa | |
| 6,617,651 B2 | 9/2003 | Ohsawa | |
| 6,661,042 B2 | 12/2003 | Hsu | |
| 6,891,225 B2 | 5/2005 | Horiguchi et al. | |
| 2002/0024081 A1 | 2/2002 | Gratz | |
| 2002/0028541 A1 | 3/2002 | Lee et al. | |
| 2002/0038886 A1 | 4/2002 | Mo | |
| 2004/0042256 A1 | 3/2004 | Forbes | |
| 2004/0108532 A1 | 6/2004 | Forbes | |
| 2004/0174734 A1 | 9/2004 | Forbes | |

OTHER PUBLICATIONS

U.S. Appl. No. 10/739,253, filed Dec. 18, 2003, Leonard Forbes.

(Continued)

Primary Examiner—Matthew Smith
Assistant Examiner—Thanh V. Pham
(74) Attorney, Agent, or Firm—Knobbe, Martens, Olson & Bear LLP

(57) ABSTRACT

A memory cell which is formed on a substrate of a first conductivity type. A pillar of the first conductivity type extends vertically upward from the substrate. A source region of a second conductivity type is formed in the substrate extending adjacent to and away from a base of the pillar. A drain region of the second conductivity type is formed in an upper region of the pillar. A gate dielectric and conductor are arranged along a first side of the pillar. A capacitor dielectric and body capacitor plate are arranged along an opposite, second side of the pillar. A depletion region around the source region defines a floating body region within the pillar which forms both a body of an access transistor structure and a plate of a capacitor structure. The cell also provides gain with respect to charge stored within the floating body.

15 Claims, 10 Drawing Sheets

OTHER PUBLICATIONS

U.S. Appl. No. 10/808,058, filed Mar. 24, 2004, Leonard Forbes.

P. Fazan et al., "Capacitor-less 1-transistor DRAM", IEEE International SOI Conference, 2002, pp. 10-13.

P.C. Fazan et al., "A simple 1-transistor capacitor-less memory cell for high performance embedded DRAMs", Proceedings of the IEEE Custom integrated Circuits Conference 2002, pp. 99-102.

T. Ohsawa et al., "Memory Design Using a One-Transistor Gain Cell on SOI", IEEE Journal of Solid-State Circuits, vol. 37, No. 11, pp. 1510-1522, Nov. 2002.

Paul Kallender, "Swiss team develops single-transistor SOI DRAM cell", http://www.eetimes.com/story/OEG20011016S0099, Oct. 16, 2001.

T. Ohsawa et al., "Memory Design Using One-Transistor Gain Cell on SOI", IEEE Int. Solid State Circuits Conference, San Francisco, 2002, pp. 152-153.

T. Ohsawa et al., "A Memory Using One-Transistor Gain Cell on SOI(FBC) with Performance Suitable for Embedded DRAM's" Symposium on VLSI Circuits, 2003, Jun. 12-14, pp. 93-96.

HIGH-DENSITY SINGLE TRANSISTOR VERTICAL MEMORY GAIN CELL

BACKGROUND OF THE INVENTION

1. Field of the Invention

The invention relates to the field of semiconductor transistors and more particularly to a single transistor memory gain cell of high density.

2. Description of the Related Art

Semiconductor memory devices are widely employed in a wide variety of electronic devices such as consumer electronics, computer systems, etc. The semiconductor memory devices can provide storage capacity for operating software as well as data storage, such as for text files, audio/video files, etc. A popular and commonly employed type of memory is known as dynamic random access memory (DRAM). DRAM provides the advantage of relatively rapid ability to write and read data as well as a relatively simple circuit design which facilitates relatively high circuit density and corresponding large memory capacity.

FIG. 1 is a cross-sectional view of a typical prior art DRAM array where a plurality of individual DRAM cells are arrayed to define a memory circuit. These prior art DRAM cells are formed in a silicon-on-insulator (SOI) substrate where an active layer of silicon overlies an underlying buried oxide (BOX) layer. Alternating n-type and p-type regions are formed in the active layer with gate stacks formed to overlie the p-type regions so as to define an n-type metal oxide semiconductor (NMOS) transistor. The p-type regions are also isolated by the n-type regions disposed on either side and the underlying BOX layer to define floating bodies. As can be seen in the Figure, this defines a generally planar structure where the various components of the memory cells are aligned in a generally horizontal manner along the major plane of the SOI upon which the devices are made.

The usual utilization for the DRAM array is to interconnect the drain regions along a first direction with a bit/data line and the gates along a second direction via corresponding word lines such that an individual cell can be accessed by addressing the corresponding bit/data line and word line to read from, or write to, the individual cell where the bit/data line and word line intersect. The DRAM cell also typically includes a capacitor structure to which the NMOS transistor is connected. The capacitor stores charge to define the logic state of the particular cell. The NMOS transistor acts as an access transistor such that by selecting a given access transistor, the charge storage state of the associated capacitor can be determined.

There is a continuing desire in the field for increased storage capacity of memory devices, such as DRAM memory, as well as a corresponding desire for increased speed of operation. This is frequently addressed by reducing the physical size of individual memory cells (scaling), thus allowing a greater circuit density and device count for a given area of semiconductor substrate in which the individual devices are formed. However, there are ever-present limitations to the degree to which further reduction in size and corresponding increase in the total count and density of individual devices may be practically realized with current semiconductor processing technologies.

One way of addressing these limitations is to employ innovative device architectures which may facilitate fabricating individual devices of reduced size. Examples of this can be described with the explanatory vehicle of a DRAM cell. A typical DRAM cell includes a single n-type metal oxide semiconductor (NMOS) transistor connected to a separate charge storage device, such as a capacitor. Thus, scaling to reduce the size of the DRAM cell involves scaling both the NMOS transistor and the capacitor charge storage device. Efforts have been made to further reduce the footprint, or amount of the planar surface of the substrate occupied by the DRAM cell, by incorporating vertical structures in the DRAM cell. For example, transistors and capacitor structures are known which extend vertically upwards from the substrate or downwards into the substrate, such as with a trench structure. Scaling however can lead to difficulties in operation of the devices as reduction in the size of the capacitor, as well as reduction in operating voltages reduces the available electrical signal output from the memory cells making reliable read/write operations to the memory cells more difficult. An additional difficulty is that with the reduced physical size and operating voltages attendant to scaling, so-called soft errors can more frequently arise when incident radiation, such as alpha particles, activates charge carriers in the cell structure which can lead to errors in the proper read/write of the intended logic state of an individual device.

A further difficulty is that trench capacitors formed in the trenches in the semiconductor substrate are subject to trench-to-trench charge leakage enabled by the parasitic transistor effect between adjacent trenches. As the fabrication dimensions are reduced, this leakage effect is enhanced which can drain the capacitor leading to a loss of stored data. Also, incident alpha particle radiation can generate whole/electron pairs in the semiconductor substrate which functions as one of the storage plates of the trench capacitors. This can also cause charge stored on the effected capacitor to dissipate, leading to the aforementioned soft errors. Stacked capacitors of a sufficient capacitance for reliable cell operation present a substantial vertical extent, thus also limiting further reductions in total cell size while maintaining reliable cell operation.

It will thus be appreciated that there is a continuing need for innovative memory cell architectures which can satisfy the continuing demand for reduced cell size and corresponding increase in device count and density while maintaining reliable device operation and feasible and economical fabrication. There is also a need for cell architectures of reduced dimensions which are resistant to errors, such as the soft errors induced by incident alpha particle radiation.

SUMMARY OF THE INVENTION

Embodiments of the invention provide a high density memory cell. Preferred embodiments avoid the need for expensive epitaxial silicon processes and provide a simple device architecture that can be readily adapted to existing processing technologies. Preferred embodiments provide a small footprint and an efficient volumetric use of a semiconductive substrate. Preferred embodiments provide gain with respect to charge stored in the cell and are resistant to soft errors, such as induced by incident alpha particle radiation.

One embodiment comprises a memory cell comprising a substrate of a first conductivity type, a pillar of the first conductivity type extending vertically upward from the substrate, a source region of a second conductivity type formed in the substrate extending adjacent to and away from a base of the pillar, a drain region of the second conductivity type formed in an upper region of the pillar, a gate dielectric and conductor arranged along a first side of the pillar, and a capacitor dielectric and body capacitor plate arranged along an opposite, second side of the pillar.

Another embodiment comprises an array of memory cells comprising a substrate of a first conductivity type, an arrayed plurality of pillars of the first conductivity type extending vertically upward from the substrate, source lines of a second conductivity type formed in the substrate extending in a first direction between adjacent pillars and extending substantially adjacent bases of the adjacent pillars, drain regions of the second conductivity type formed in upper regions of the pillar, data/bit lines interconnecting a plurality of corresponding drain regions and extending in a second direction, gate dielectric and conductors arranged along first sides of the pillars, word lines interconnecting corresponding gate conductors and extending in the first direction, and capacitor dielectric and body capacitor plates arranged along opposite, second sides of the pillars.

Yet another embodiment comprises a memory cell comprising a vertically extending pillar of semiconductor material, a source region formed adjacent a base of the pillar, a drain region formed in an upper region of the pillar, a gate dielectric and conductor arranged along a first side of the pillar, and a capacitor dielectric and body capacitor plate arranged along an opposite, second side of the pillar wherein charge stored within the pillar determines conductivity between the drain and source regions so as to define a logic state of the cell.

A further embodiment comprises a method of forming memory cells comprising patterning and etching a substrate comprised of semiconductor material doped a first conductivity type so as to form trenches extending along intersecting first and second directions so as to define a plurality of vertically extending pillars, filling the trenches with oxide, selectively removing the oxide from trenches extending in the first direction, doping upper regions of the pillars and the trenches extending in the first direction with dopant of a second conductivity type so as to define drain regions and source lines respectively, depositing gate dielectric along first sides of the pillars, depositing capacitor dielectric along opposed second sides of the pillars, forming conductive word lines extending along the first direction atop the gate dielectric, forming body capacitor plates atop the capacitor dielectric and forming data/bit lines interconnecting drain regions along the second direction.

These and other objects and advantages of the present invention will become more fully apparent from the following description taken in conjunction with the accompanying drawings.

DETAILED DESCRIPTION OF THE PREFERRED EMBODIMENTS

Figure 1:
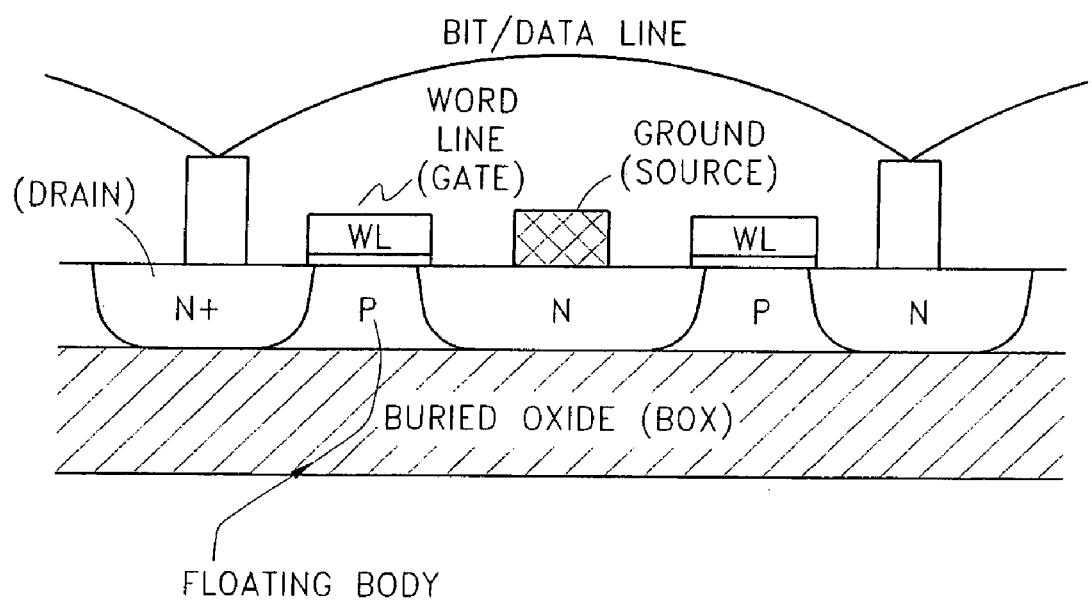
FIG. 1 is a section view of a typical prior art SOI floating body DRAM cells.

Reference will now be made to the drawings wherein like reference numerals refer to like structures and materials throughout. It will be understood that the figures are provided for illustrative purposes for the various embodiments described herein and should not be interpreted as being to scale or illustrating precise quantitative or proportional relationships.

Figure 2:
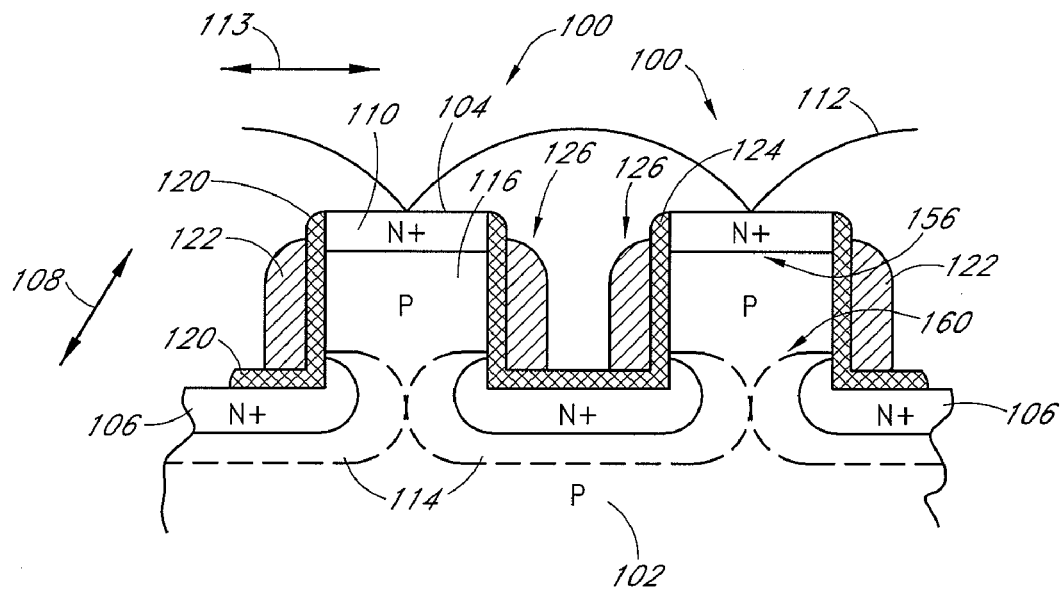
FIG. 2 is a section view of one embodiment of high density vertical memory gain cells.

FIG. 2 illustrates, in cross-sectional view, one embodiment of a single transistor memory gain cell 100. The cell 100 provides a readily fabricatable high-density memory gain cell that can facilitate extremely high device densities and is resistant to soft errors, such as from incident alpha particle radiation. The structure, operation of, and fabrication of the cell 100 will be described in this embodiment with analogy to an n-type metal oxide semiconductor (NMOS) transistor for ease of understanding. However, it will be understood that in other embodiments, an analogous complimentary p-type (PMOS) embodiment can be equally realized, as well as a combined n-type and p-type (CMOS) embodiment employing the teachings herein.

In this embodiment, the cell 100 comprises a substrate 102 which, in this embodiment, comprises silicon p-type doped with boron at approximately $10^{14}/cm^3$. The cell 100 also comprises a generally vertically extending pillar 104 which, in this embodiment, comprises silicon more heavily doped p-type than the substrate 102 and in this embodiment higher than $10^{17}/cm^3$. Source lines 106 are also formed at an upper region of the substrate 102 so as to extend generally in a first direction 108 substantially along the view of the cross-sectional illustration of FIG. 2 or substantially into and out of the page. The source lines 106 in this embodiment, are positioned adjacent a base of the pillars 104 and are further arranged so as to be substantially not underlying the pillars 104, but rather extending substantially between adjacent pillars 104. In this embodiment, the source lines 106 comprise regions of the substrate 102 which have been relatively heavily doped n-type with phosphorus or arsenic and, in this embodiment, at greater than $10^{19}/cm^3$.

Drain regions 110 are also formed at upper regions of the pillars 104. The drain regions 110 comprise these upper portions of the pillars 104 that, in this embodiment, have been doped n-type with phosphorus or arsenic at greater than $10^{19}/cm^3$. The drain regions 110 are interconnected in this embodiment via corresponding data/bit lines 112 extending generally in a second direction 113. In certain embodiments, the first 108 and second 113 directions are arranged substantially perpendicular to each other, such as for ease of fabrication. However, in other embodiments, the first 108 and second 113 directions intersect, but are not orthogonal.

The source lines 106 define depletion regions 114 and, in this embodiment, the characteristics of the source lines 106 and dimensions of the pillars 104 are preferably selected such that adjacent depletion regions 114 merge with each other under the pillars 104. This defines floating body regions 116 in the pillars 104 comprising p-type material which is isolated or pinched off from the substrate 102 by the depletion regions 114. In this embodiment, lateral dimensions of the pillars 104 of approximately 100 nanometers and the source lines 106 formed as previously described, will provide these floating bodies 116.

Further in this embodiment, a gate dielectric 120 is formed along a first side or face of respective pillars 104 and also so as to extend at least partially over a corresponding source line 106 extending adjacent the base of the respective pillars 104. In this embodiment, the gate dielectric 120 is formed of 10 nm or less of silicon oxide. Gate/word lines 122, in this embodiment comprising polysilicon, are formed to also extend substantially in the first direction so as to abut a corresponding portion of the gate dielectric along the first face or side of respective pillars 104.

This embodiment of the cell 100 also comprises a capacitor dielectric 124 formed along an opposite second face or side of the respective pillars 104 and along the upper surface of the substrate 102 intermediate adjacent pillars 104. In this embodiment, the capacitor dielectric 124 preferably comprises a relatively high dielectric constant insulator and, in this embodiment, comprises aluminum oxide formed with a thickness of approximately 10 nm or less. In other embodiments, suitable materials for high dielectric constant insulators comprising the gate dielectric 120 and/or capacitor dielectric 124 include hafnium oxide and zirconium oxide having dielectric constants of $\kappa \geq$ approximately 25. The cell 100 also comprises body capacitor plates 126, in this embodiment, comprising polysilicon extending also generally in the first direction 108 and formed along the second sides or faces of the respective pillars 104.

Thus, in this embodiment, the cell 100 defines a transistor structure comprising the pillar 104 with p-type floating body 116 region, n-type source line 106 and drain region 110, gate dielectric 120, and gate/word line 122. While the cell 100 differs from conventional DRAM cells, these components do share some similar structural, material, and operational characteristics with conventional planar and vertically arranged NMOS transistors and, thus following reference will be made to an NMOS structure 130 defined by the substrate 102, the pillar 104, source line 106, drain region 110, gate dielectric 120, and gate/word line 122, for ease of operational understanding. As previously noted, it will be understood that other embodiments comprise a complementary configuration of n-type substrate and pillars and p-type source and drain regions analogous to PMOS transistors as well as combined technologies employing both types.

Figure 3:
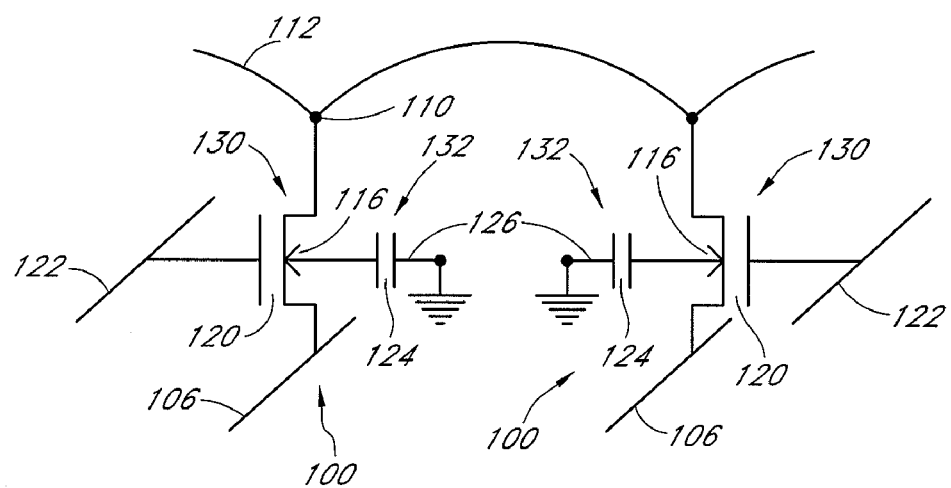
FIG. 3 is an electrical circuit diagram of the memory gain cells of FIG. 2.

In this embodiment, a body capacitor 132 is also defined by the semi-conductive floating body 116 and conductive body capacitor plates 126 with the capacitor dielectric 124 interposed therebetween. Thus, the floating body 116 is comprised both within the NMOS structure 130 as well as the body capacitor 132. This provides both an extremely high density architecture which facilitates advancement in overall cell size reduction and corresponding increase in device count or density as well as offering operational advantages which will be described in greater detail below. FIG. 3 is an electrical circuit diagram of the embodiments of the cell 100 previously described with respect to FIG. 2. As can be seen, the floating body 116 is shared both by the body capacitors 132 and respective NMOS structures 130.

Figure 4:
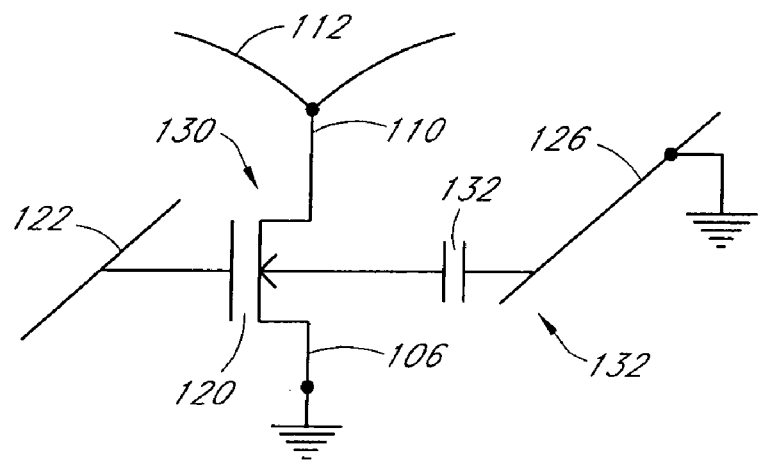
FIG. 4 is a circuit diagram of one embodiment of a single memory gain cell.

The operation of various embodiments of single cells 100 will now be explained with reference to FIGS. 4-10. FIG. 4 illustrates one embodiment of cell 100 and the operation thereof where, in this embodiment, the source line 106 is grounded as is the body capacitor plate 126. Operating bias potentials can be applied as shown in FIGS. 6 and 8-10. In this embodiment, data or a logic "one" state 134, is written onto the cell 100 by applying positive voltage to the gate 122 and the drain region 110 which is believed to cause avalanche breakdown and the floating body 116 to collect holes which are generated so as to leave a stored charge 136, as shown schematically in FIG. 8.

A standby, or hold state 140, is realized in this embodiment by placing the gate or word line 122 at a negative voltage which drives the floating body 116 to a negative potential by virtue of the capacitive coupling of the body 116 to the gate or word line 122. This reverse biases pn junctions 156, 160 defined between the floating body 116 and the drain region 110 and the source line 106 respectively so as to inhibit leakage of stored charge 136 as shown schematically in FIG. 9.

Figure 10:
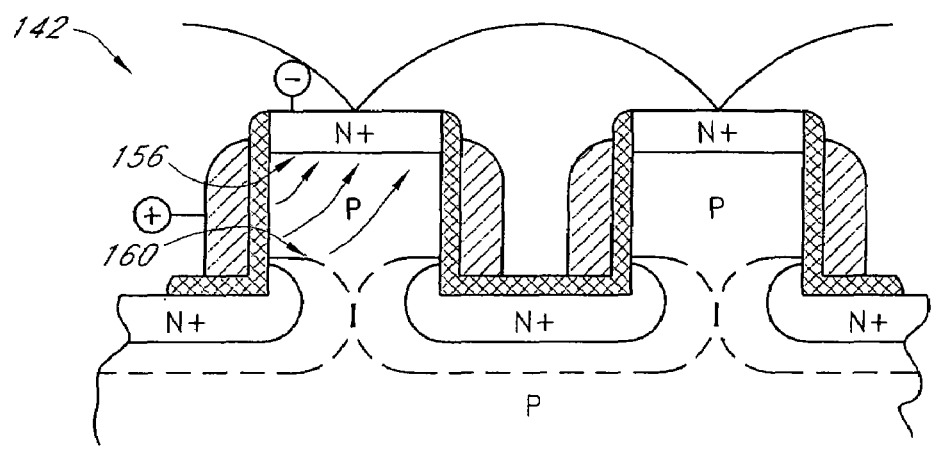
FIG. 10 illustrates the cell of FIGS. 8 and 9 with a clear or write logic "zero" condition.

The data, or logic "one" state 134, is cleared by writing a logic "zero" 142 to the cell 100 by applying a positive potential to the gate or word line 122 and biasing the drain 110 to a negative potential, as shown in FIG. 10. This forward biases the pn junction 156 between the floating body 116 and drain region 110 and removes the stored charge 136.

Figure 7:
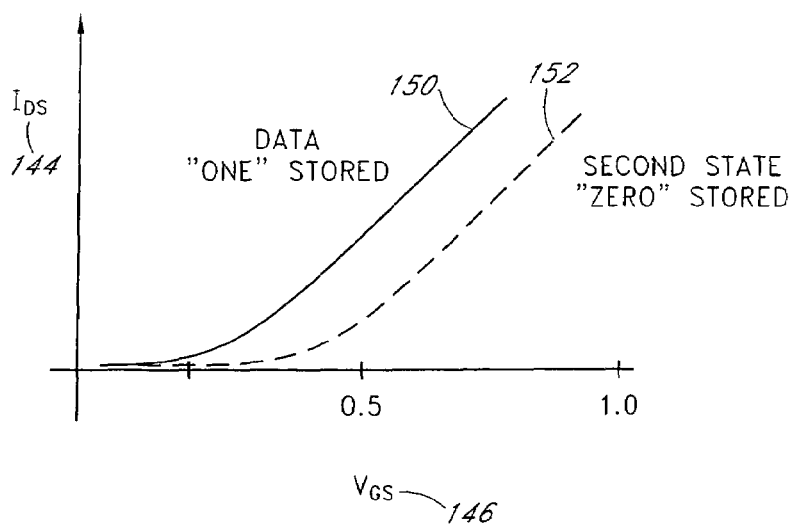
FIG. 7 illustrates parameters for read operations for embodiments of vertical memory gain cells.
Figure 8:
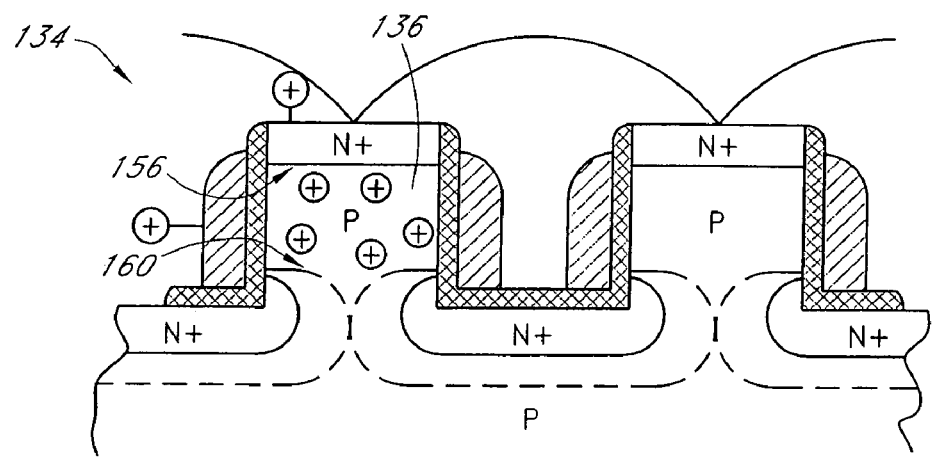
FIG. 8 illustrates one embodiment of a memory gain cell with data or a logic "one" written to the cell.
Figure 9:
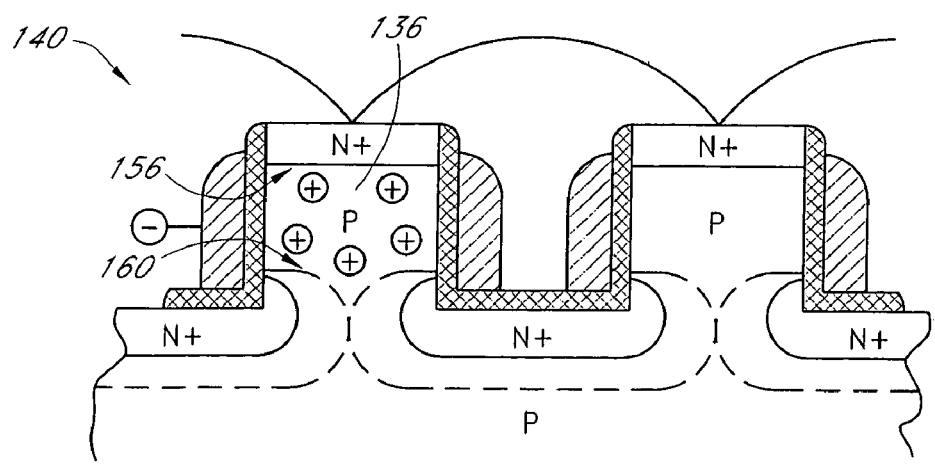
FIG. 9 illustrates the cell of FIG. 8 in a standby or hold condition.

Read operations of the cell 100 can be performed by addressing the word line 122 and determining the conductivity of the cell 100, which in this embodiment is the conductivity between the drain region 110 and source line 106. Thus, in this embodiment, a current $I_{DS}$ 144 between the drain region 110 and source line 106 of the NMOS structure 130 can be established with a potential established therebetween. The $I_{DS}$ 144 can be sensed and evaluated in a known manner with respect to an applied potential between the gate 122 and source line 106, indicated in FIG. 7 as $V_{GS}$ 146. In this embodiment, if the floating body 116 has sufficient stored charge 136 to define a data or logic "one" 134, the body 116 will have a more positive potential than otherwise. This causes a threshold voltage $V_{GS}$ 146 required to obtain a given $I_{DS}$ 144 to be lower with data or logic "one" 134 than with logic "zero" 142. Thus, as can be seen in FIG. 7, with a logic state "one" 134 stored in the cell 100, $I_{DS}$ 144 is greater at a given $V_{GS}$ 146 describing a curve $I_1$ 150. Alternatively, with a logic "zero" 142 stored in the cell 100, $I_{DS}$ 144 is correspondingly lower at a given $V_{GS}$ 146 describing a curve $I_0$ 152.

Figure 5:
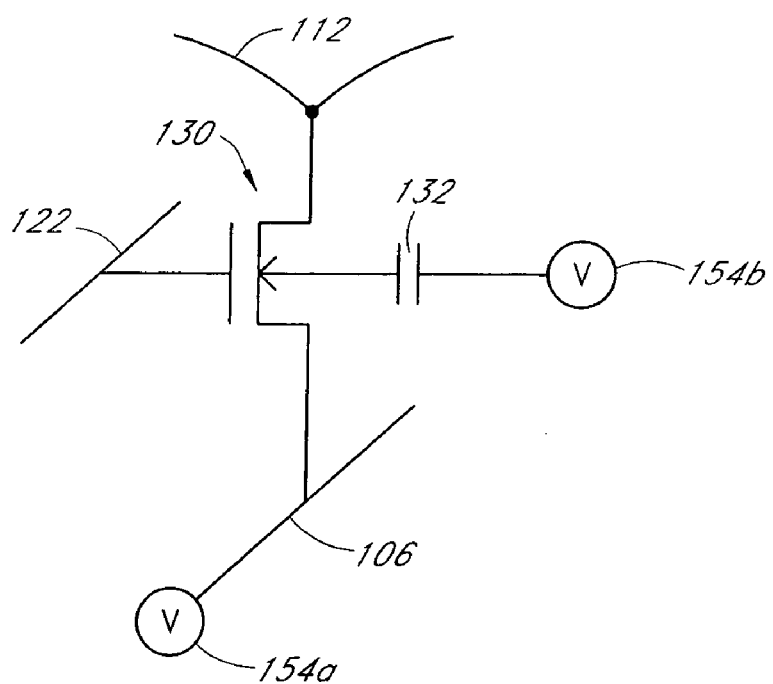
FIG. 5 is a circuit diagram of another embodiment of a single memory gain cell.
Figure 6:
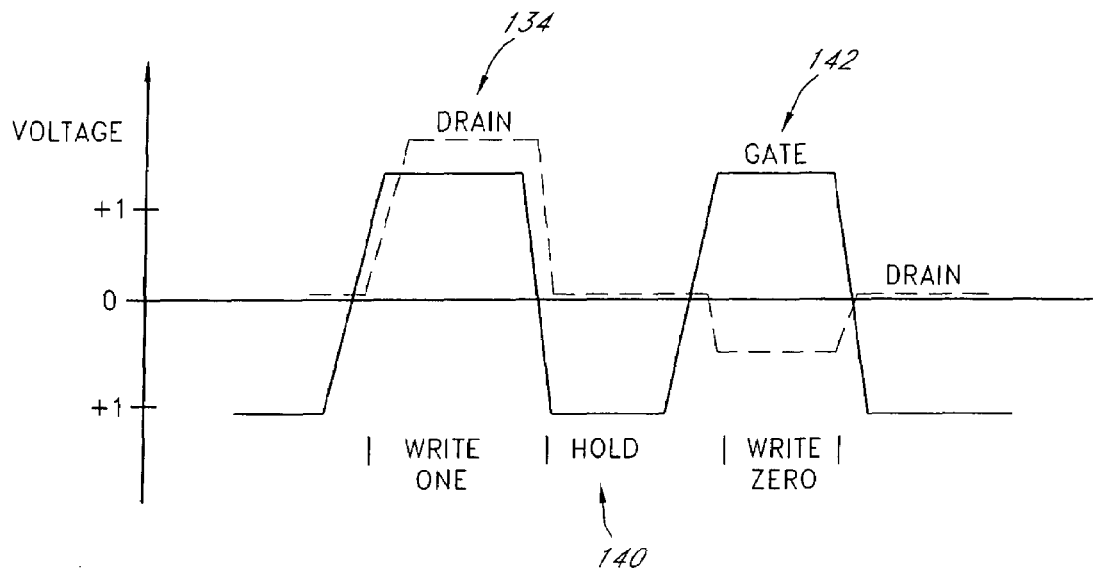
FIG. 6 illustrates parameters for write operations to embodiments of vertical memory gain cells.

Other embodiments will now be described with reference to FIG. 5. In contrast to the embodiments described with respect to FIG. 4 wherein the source line 106 and body capacitor plates 126 are grounded, in these embodiments, either or both of the source line 106 and body capacitor plate 126 are connected to variable voltage sources 154a and 154b, respectively. One specific embodiment is to drive not only the gate or word line 122, but also the body capacitor plate 126 to a negative potential during the standby or hold state 140. In this embodiment, the floating body 116 is driven to an even more negative potential during the standby or hold state 140 to further inhibit the floating body 116/drain region 110 pn junction 156 and floating body 116/source line 106 pn junction 160 from becoming unintentionally forward biased and draining stored charge 136.

Another embodiment is to provide a positive potential to the source line 106 by the variable voltage source 154a. This can be used in conjunction with provision of a negative voltage to the word line 122 to drive the pn junction 156 defined by the p-type floating body 116 and n-type drain region 110 as well as the pn junction 160 defined by the p-type body and n-type source line 106 to larger reverse biases during the standby or hold state 140. This provides a back-to-back, strongly reverse biased arrangement between the pn junctions 156 and 160 which provides increased resistance against the floating body 116 becoming forward biased during the standby state 140 and thus also increased resistance to loss of charge 136 due to leakage currents. In one particular embodiment, the word line 122, body capacitor plates 126, and source line 106 are connected with parallel lines and thus all cells 100 along a given word line 122 can be simultaneously placed in a given condition, such as the standby state 140.

A similar alternative embodiment can be provided for the clear or logic "zero" state 142 by driving the word line 122 and/or the body capacitor plate line 126 to a positive potential and the source line 106 to a negative potential. In this embodiment, these lines are parallel and this will clear, or write logic "zero" 142, to all cells 100 along any given word line 122.

The cells 100, in addition to acting as memory cells 100 as previously described, also function as gain cells 100 by providing a very high gain or amplification with respect to stored charge 136 on the floating body 116 of the cells 100. More particularly, a significant change in a threshold voltage $V_{GS}$ 146 is caused by a relatively small charge 136 stored on the floating body 116. Correspondingly, a relatively large increase (in certain embodiments a factor of approximately one to two orders of magnitude) in the number of electrons conducted between the drain region 110 and source line 106 of the cell 100, e.g. $I_{DS}$ 144 is realized for each stored charge 136.

Thus for example, during a read data operation as previously described, the NMOS structure 130 of the cell 100 can be considered as a transistor providing gain or amplification. This amplification allows a relatively small storage capacitance of the body capacitor 132 comprising the floating body 116 and body capacitor plate 126 to be effectively used and avoids the requirements for the capacitance and space requirements of a relatively large stacked capacitor structure of the prior art. These embodiments thus result in the cell 100 having a very high density with an overall area of the cell 100 of approximately $4F^2$ where F is the minimum feature size and wherein the vertical extent of the cell 100 is far less than the total height of a stacked capacitor or trench capacitor and access transistor combinations as are previously known.

An additional advantage of these embodiments is that soft error rates in the cells 100 are reduced because largely only charge, such as caused by ionizing radiation, generated in the relatively small volume of the floating body 116 in the pillar 104 will be collected. Charge which is generated in the substrate 102 by ionizing radiation will be collected and shorted to ground by the zero biased, or reversed biased, source lines 106, depending on the particular embodiment. The retention time of the cells 100 will also be longer than known SOI structures since the surfaces of the floating body 116 comprise high quality oxidized silicon surfaces with a relatively low surface state generation rate. The silicon-insulator interfaces in known SOI structures have, in general, a relatively higher generation rate with corresponding higher leakage currents which lead to a correspondingly lower retention time than in the embodiments described herein.

Further advantages of these embodiments of the cells 100 are that the capacitance of the body capacitor 132 and, thus, the storage capacitance of the cell 100, can be readily increased without increasing the physical size of the cells 100 by using relatively high dielectric constant insulators for the capacitor dielectric 124 providing insulation between the body capacitor plates 126 and the pillar 104, and underneath the body capacitor plates 126. The capacitor dielectric 124 is not required to have low surface state densities when deposited on the substrate 102, in this embodiment comprising silicon, since in the cell 100 of this embodiment, there is no transistor channel which would typically provide a conduction path upward along this surface. Advantageously, a relatively high dielectric constant for the capacitor dielectric 124, in this embodiment comprising aluminum oxide, having a negative fixed charge is beneficial by accumulating the surface of the p-type floating body region 116. In other embodiments, the capacitor dielectric 124 can comprise other high dielectric constant insulators, such as hafnium oxide and zirconium oxide.

In addition, if the quality of a silicon-insulator interface is good, as in these embodiments, relatively high dielectric constant materials can also be used for the gate dielectric 120 of the NMOS structure 130 of the cell 100 to increase gate drive current. The Applicant has previously disclosed a large number of different dielectric materials which can be realized, such as by atomic layer deposition, evaporation, and/or the oxidation of metals which can be used for the gate dielectric 120 as well as the capacitor dielectric 124. Further information may be found in U.S. application Ser. Nos. 10/739,253 and 10/808,058 both of which are incorporated herein in their entireties by reference.

Figure 11:
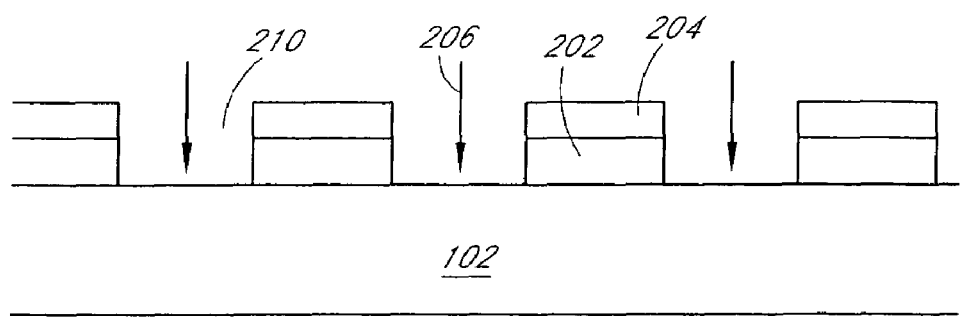
FIGS. 11 through 15 illustrate intermediate steps of embodiments of fabrication of high density vertical memory gain cells.
Figure 12:
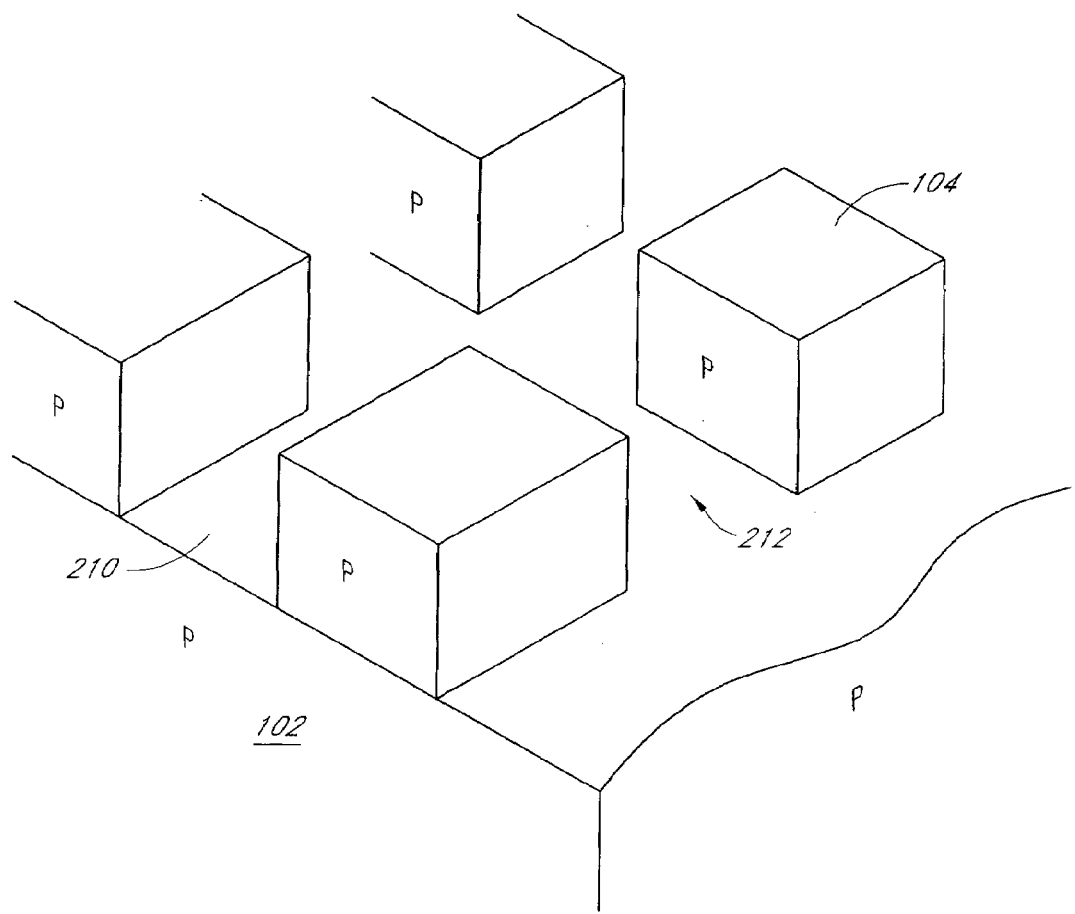

Embodiments of fabrication of the cells 100 will now be described with reference to the illustrations of FIGS. 11-15. As shown in FIG. 11, the substrate, or wafer 102, is first oxidized to provide an oxide layer 202 approximately 10 nm thick. Then a silicon nitride layer 204 is deposited to act as an etch mask. The silicon nitride mask layer 204 and underlying oxide 202 are patterned and then an anisotropic etch 206 is performed to create intersecting trenches 210 extending in the first direction 108 and trenches 212 extending in the second direction 113 as shown in FIG. 12.

The trenches 210, 212 are then filled with oxide 214 and the whole structure is planarized, in this embodiment by chemical mechanical polishing (CMP). The oxide 214 is then removed from the trenches 210 such that oxide 214 remains in regions of the trenches 212 not coincident with the trenches 210 as shown in FIG. 12. Thus, oxide 214 is interposed between adjacent pillars 104 along the first direction 108, but substantially absent along the trenches 210.

Figure 13:
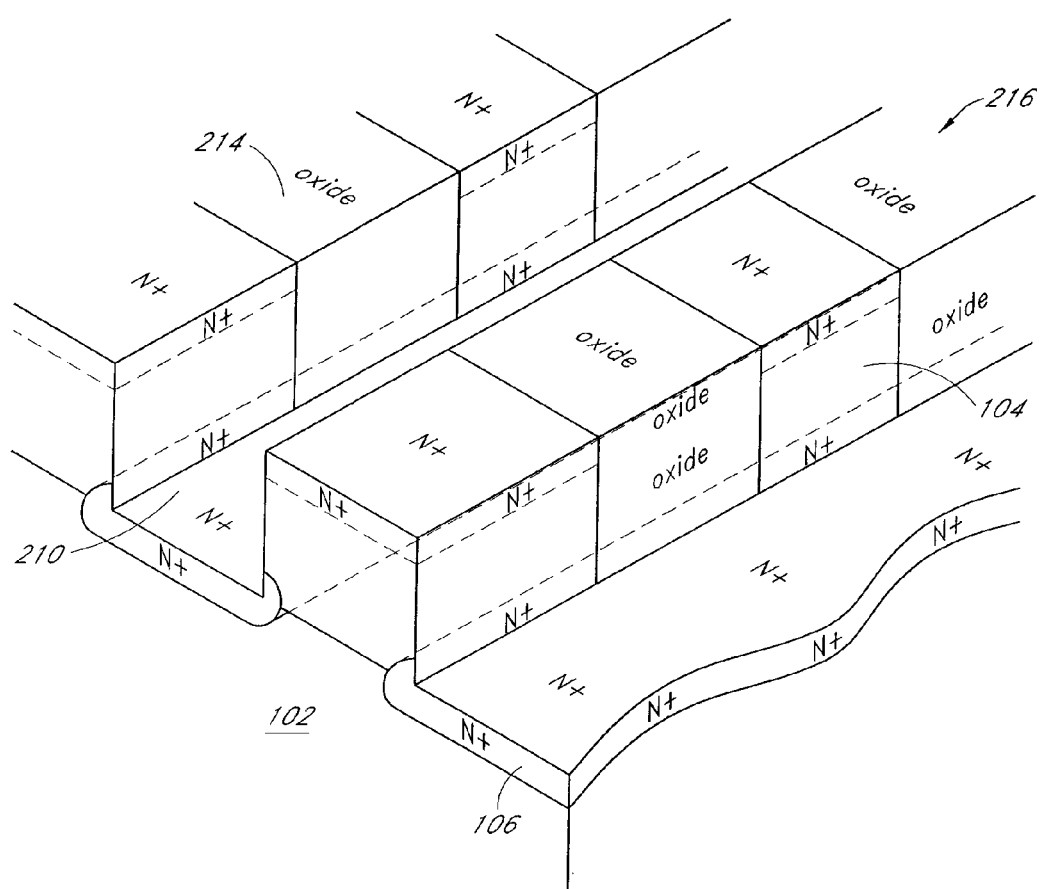

The source lines 106 are formed in the trenches 210 with the parameters previously described as illustrated in FIG. 13. The drain regions 110 are also formed in the upper regions of the pillars 104, also as previously described. The placement of the source lines 106 along the lower edges of the trenches 210 provides a simplified manufacturing process as, in one embodiment, a single implantation step can be performed to provide the n-type doping previously described so as to form both the source lines 106, positioned along the bottom of the trenches 210, as well as the drain regions 110 atop the pillars 104 in a single implantation step.

Figure 14:
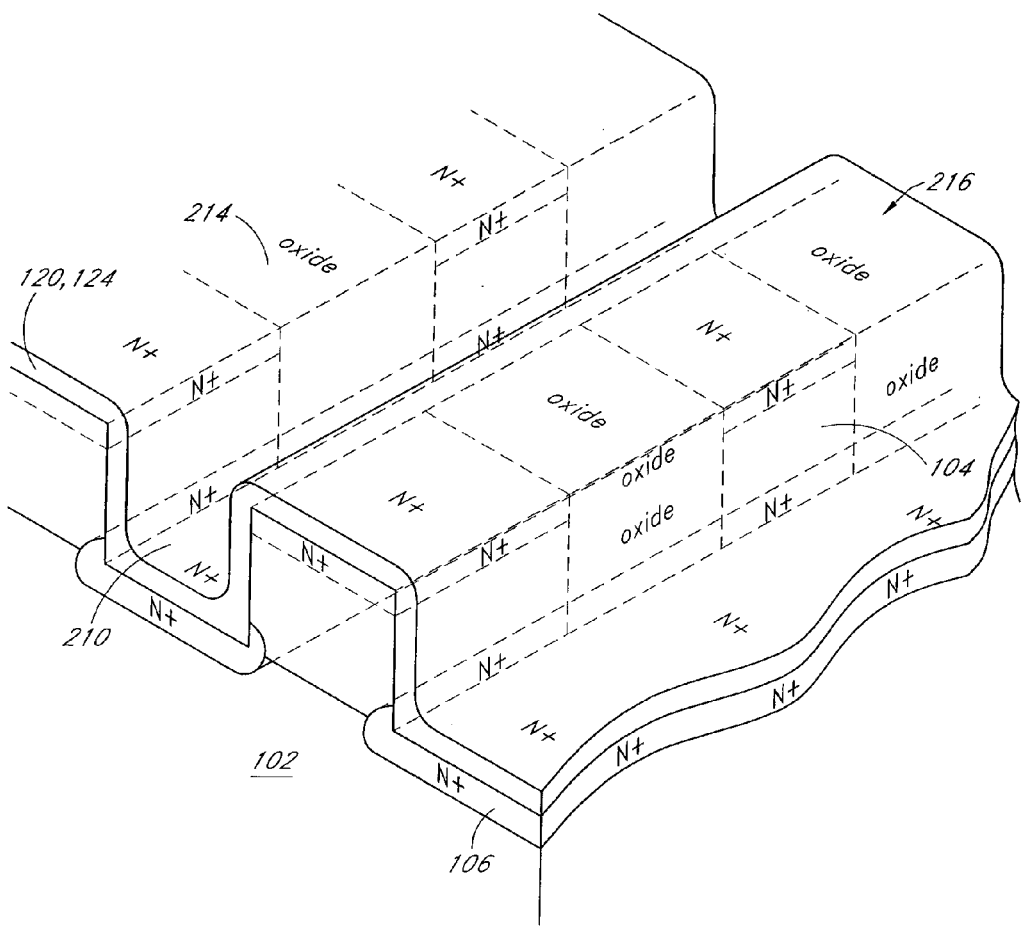
Figure 15:
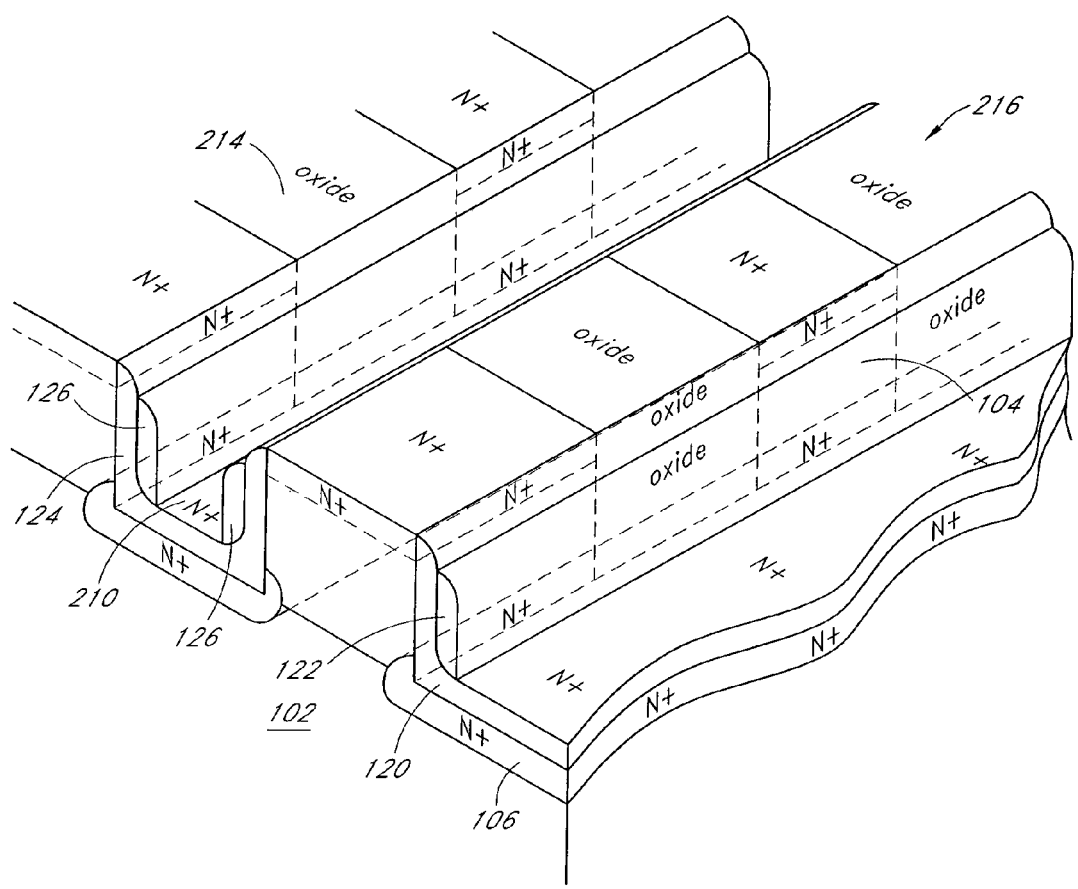

The gate dielectric 120 and capacitor dielectric 124 are formed as illustrated in FIG. 14. In this embodiment, the gate dielectric 120 and capacitor dielectric 124 are formed together. The gate/word lines 122 and body capacitor plates 126 are then formed as shown in FIG. 15. The data/bit lines 112 can also be realized by conventional metallurgy techniques. General techniques and processes adaptable for forming the embodiments of cells 100 described herein can be found in U.S. Pat. Nos. 5,936,274; 5,973,356; 5,991,225; 6,072,209; 6,097,065; 6,124,729; 6,143,636; 6,150,687; 6,153,468; and 6,238,976 which are all incorporated herein in their entireties by reference.

Thus, an array 216 of the cells 100 is provided. In this embodiment, individual cells 100 comprising the pillars 104 are positioned in the array 216 in a generally uniform rectangular arrangement defined by the intersecting trenches 210 and 212 extending generally along the first direction 108 and second direction 113, respectively. It will be appreciated, however, that in other embodiments, the arrangement of individual cells 100 in the array 216 can adopt an offset substantially rectangular arrangement or non-rectangular arrangement without detracting from the scope of the invention.

The embodiments of cells 100 previously described also provide a particularly efficient volumetric usage of material as a single region of material, the floating body 116, comprises both a body of the NMOS structure 130 as well as the body capacitor 132. This provides both a particularly efficient use of the material comprising the cells 100, as well as providing reduced exposure for soft error occurrences, as previously described.

The cells 100 admit use of relatively high dielectric constant insulators as well as provide both memory and gain functionality. The cells 100 are much simpler than conventional stacked capacitor or trench capacitor DRAM cells and have a shorter vertical extend. The cells 100 replace the relatively large storage capacitors which consume a significant footprint in known DRAM cells with the relatively much smaller body capacitor 132. These cells 100 further utilize the active gain of the NMOS structure 130 to amplify any stored charge 136. Specialized processes are not required for the fabrication of the cells 100 and, thus, can be implemented using standard CMOS processing techniques providing significant financial advantages for implementation of the embodiments described herein.

Although the preferred embodiments of the present invention have shown, described and pointed out the fundamental novel features of the invention as applied to those embodiments, it will be understood that various omissions, substitutions and changes in the form of the detail of the device illustrated may be made by those skilled in the art without departing from the spirit of the present invention. Consequently, the scope of the invention should not be limited to the foregoing description but is to be defined by the appended claims.

What is claimed is:

1. A memory cell comprising:
a substrate of a first conductivity type;
a pillar of the first conductivity type extending vertically upward from the substrate;
a source region of a second conductivity type formed in the substrate extending adjacent to and away from a base of the pillar, wherein the source region is configured to be driven to a variable potential;
a drain region of the second conductivity type formed in an upper region of the pillar;
a gate dielectric and conductor arranged along a first side of the pillar; and
a capacitor dielectric comprised of material having a dielectric constant greater than or equal to 25 and body capacitor plate arranged along an opposite, second side of the pillar.

2. The cell of claim 1, wherein a depletion region is defined around the source region so to define a floating body region in the pillar between the drain and source regions.

3. The cell of claim 2, wherein a transistor structure is defined by the source region, the floating body region, the drain region, and the gate dielectric and conductor and a capacitor structure is defined by the floating body and the capacitor dielectric and body capacitor plate.

4. The cell of claim 3, wherein the transistor structure provides an access transistor and the capacitor structure provides a charge storage device of the memory cell.

5. The cell of claim 3, wherein the transistor structure provides gain with respect to charge stored in the floating body.

6. The cell of claim 3, wherein the substrate and pillar comprise p-type doped silicon and the source and drain regions comprise n-type doped silicon, such that the transistor structure comprises an NMOS type transistor structure and wherein the source region is configured to be driven to a negative potential.

7. The cell of claim 2, wherein a first logic state is defined by storage of charge within the floating body and a second logic state is defined by removal of stored charge from the floating body.

8. The cell of claim 7, wherein the logic state of the cell is determined by evaluating a conductance between the drain and source regions with a given potential applied to the gate conductor.

9. The cell of claim 1, wherein both the gate dielectric and the capacitor dielectric comprise material having a dielectric constant value of greater than approximately 25 so as to provide increased gate drive current and capacitance of the capacitor structure respectively.

10. An array of memory cells comprising:
a substrate of a first conductivity type;
an arrayed plurality of pillars of the first conductivity type extending vertically upward from the substrate;
source lines of a second conductivity type formed in the substrate extending in a first direction between adjacent pillars and extending substantially adjacent bases of the adjacent pillars;
drain regions of the second conductivity type formed in upper regions of the pillar;
data/bit lines interconnecting a plurality of corresponding drain regions and extending in a second direction;
gate dielectric and conductors extending generally in the first direction and arranged along first sides of associated sets of the pillars such that a given gate dielectric and conductor is operatively engaged solely with the associated set of pillars;
word lines interconnecting corresponding gate conductors and extending in the first direction; and
capacitor dielectric and body capacitor plates extending generally in the first direction and arranged along opposite, second sides of the associated sets of the pillars such that a given gate dielectric and conductor is operatively engaged solely with the associated set of pillars.

11. The array of claim 10, wherein the pillars are arranged in a substantially rectangular arrangement.

12. The array of claim 10, wherein depletion regions are defined around the source regions such that adjacent depletion regions merge so to define floating body regions in respective pillars between the respective drain and merged depletion regions.

13. A memory cell comprising:
a vertically extending pillar of semiconductor material;
a source region formed adjacent a base of the pillar, wherein the source region is configured to be driven to a variable potential;
a drain region formed in an upper region of the pillar;
a gate dielectric and conductor arranged along a first side of the pillar; and a capacitor dielectric and body capacitor plate arranged along an opposite, second side of the pillar wherein charge stored within the pillar determines conductivity between the drain and source regions so as to define a logic state of the cell wherein a depletion region is defined around the source region so as to define a floating body region between the drain region and depletion region wherein charge stored within the floating body determines the logic state of the cell and wherein the floating body commonly forms both an access transistor structure and a capacitor structure wherein the access transistor structure comprises the floating body, the drain and source regions, and the gate dielectric and conductor and wherein the capacitor structure comprises the floating body and the capacitor dielectric and body capacitor plate.

14. The array of claim 10, wherein the source regions are configured to be driven to a variable potential.

15. The array of claim 10, wherein the capacitor dielectric is comprised of material having a dielectric constant greater than or equal to 25.

* * * * *